US007804974B2

(12) United States Patent
Paludan-Muller et al.

(10) Patent No.: US 7,804,974 B2
(45) Date of Patent: Sep. 28, 2010

(54) HEARING AID AND A METHOD OF PROCESSING SIGNALS

(75) Inventors: Carsten Paludan-Muller, Olstykke (DK); Martin Hansen, Oldenburg (DE)

(73) Assignee: Widex A/S, Lynge (DK)

( * ) Notice: Subject to any disclaimer, the term of this patent is extended or adjusted under 35 U.S.C. 154(b) by 1167 days.

(21) Appl. No.: 11/436,667

(22) Filed: May 19, 2006

(65) Prior Publication Data

US 2006/0204025 A1 Sep. 14, 2006

Related U.S. Application Data

(63) Continuation-in-part of application No. PCT/DK03/00803, filed on Nov. 24, 2003.

(30) Foreign Application Priority Data

Nov. 24, 2003 (WO) .................... PCT/DK03/00803

(51) Int. Cl.
*H04R 25/00* (2006.01)
*H03G 3/20* (2006.01)

(52) U.S. Cl. .......................... 381/317; 381/57; 381/320

(58) Field of Classification Search .................. 381/317
See application file for complete search history.

(56) References Cited

U.S. PATENT DOCUMENTS 4,731,850 A 3/1988 Levitt et al.
5,687,241 A 11/1997 Ludvigsen
2002/0037087 A1 3/2002 Allegro
2002/0191799 A1 * 12/2002 Nordqvist et al. ............. 381/60
2003/0112987 A1 6/2003 Leijon et al.
2003/0144838 A1 7/2003 Allegro

FOREIGN PATENT DOCUMENTS

EP 1 359 787 A 11/2003
EP 1359787 A2 * 11/2003

* cited by examiner

*Primary Examiner*—Brian Ensey
*Assistant Examiner*—Matthew Eason
(74) *Attorney, Agent, or Firm*—Sughrue Mion, PLLC

(57) ABSTRACT

A hearing aid (30) includes a microphone (71), a signal processor (20) and an output transducer (22), and the signal processor (20) includes a set of audio processing parameters mapped to a set of stored noise classes (12) and a noise classification block (8) for classifying the background noise for the purpose of optimizing the frequency response in order to minimize the effects of the background noise. The hearing aid may further include a neural net for controlling the frequency response. A method for reducing a noise component in a signal includes the steps of classification of the noise component, comparing the noise component to a set of known noise components, and adapting the processed audio signals according to a corresponding set of frequency response parameters.

11 Claims, 8 Drawing Sheets

$$\widehat{\text{SII Gain}} = F_{(\text{Noise class, Noise level, Band, HTL500, HTL1k, HTL2k, HTL4k})}$$

HEARING AID AND A METHOD OF PROCESSING SIGNALS

RELATED APPLICATIONS

The present application is a continuation-in-part of application No. PCT/DK03/00803, filed on Nov. 24, 2003, in Denmark, and published as WO-A1-2005/051039.

BACKGROUND OF THE INVENTION

1. Field of the Invention

This invention relates to hearing aids. Further, the invention relates to a method of processing signals in a hearing aid. More specifically, it relates to a system and to a method for adapting the audio reproduction in a hearing aid to a known sound environment.

2. The Prior Art

A hearing aid usually comprises at least one microphone, a signal processing means and an output transducer, the signal processing means being adapted to receive audio signals from the microphone and to reproduce an amplified version of the input signal by the output transducer. State of the art hearing aids are programmable, relying on a programming device adapted to change the signal processing of the hearing aid to fit the hearing of a hearing aid user, i.e. to adequately amplify bands of frequencies in the user's hearing where auditive perception is deteriorated. The combination of a hearing aid and a programming device is sometimes referred to as a hearing aid system.

Hearing aids comprising means for adapting the sound reproduction to one of a plurality of different noise environments controlled either automatically or by a user according to a set of predetermined fitting rules are known, for example from U.S. Pat. No. 5,604,812, which discloses a hearing aid capable of automatic adaptation of its signal processing characteristics based on an analysis of the current ambient situation. The disclosed hearing aid comprises a signal analysis unit and a data processing unit adapted to change the signal processing characteristics of the hearing aid based on audiometric data, hearing aid characteristics and prescribable algorithms in accordance with the current acoustic environment. The specific problems of reducing background noise and improving speech intelligibility in the reproduced signal are not addressed in particular by U.S. Pat. No. 5,604,812.

In an article entitled: "Effects of fluctuating noise and interfering speech on the speech reception threshold for impaired and normal hearing", Festen and Plomp, J. Acoust. Soc. Am, 1990, 88, pp 1725-1736, the observation is made that listeners with a sensorineural hearing loss have greater difficulty in perceiving speech masked by competing speech or modulated noise than listeners with normal hearing. The noise used is modulated in various ways, and a degree of perception is established for a representative group of both normal-hearing and hearing-impaired listeners. The difference in the perception of speech masked by unmodulated noise between listeners with normal hearing and listeners with a hearing loss is smaller than the difference in perception of speech masked by modulated noise.

A worst-case example of speech perception in modulated noise in this research is the case of noise-masking of a particular speaker with a time-reversed version of his or her own speech. In this case, the noise frequencies are similar to the speech to be perceived, and both normal-hearing listeners and hearing-impaired listeners have equal difficulties in the perception.

Thus, a need exists for a way to aid a hearing-impaired listener in perceiving and recognizing speech in modulated noise. If the character of the noise present in a given sound environment can be established with an adequate degree of certainty by a hearing aid, steps may be taken to compensate for the noise type present, and the perception of speech in that sound environment may be improved.

EP 1 129 448 B1 discloses a system and a method for measuring the signal-to-noise ratio in a speech signal. The system is capable of determining a time-dependent speech-to-noise ratio from the ratio between a time-dependent mean of the signal and a time-dependent deviation of the signal from the mean of the signal. The system utilizes a plurality of band pass filters, envelope extractors, time-local mean detectors and time-local deviation-from-mean-detectors to estimate a speech-to-noise ratio, e.g. in a hearing aid. EP 1 129 448 B1 is silent regarding speech in modulated noise.

WO 91/03042 describes a method and an apparatus for classification of a mixed speech and noise signal. The signal is split up into separate, frequency limited sub signals, each of which contains at least two harmonic frequencies of the speech signal. The envelopes of this sub signal are formed and so is a measure of synchronism between the individual envelopes of all the sub signals. The synchronism measure is compared with a threshold value for classification of the mixed signal as being significantly or insignificantly affected by the speech signal. The classification takes place with reference to an unprecedented frequency, and may therefore form the basis for a relatively precise estimate of the noise signal, in particular when this has a speech-like nature.

This method is rather complicated, as a large number of steps are required to carry out the method in practice.

Changing the audio reproduction in a hearing aid during use, for example depending on the spectral distribution of the signal processed by the hearing aid processor, might adapt the audio reproduction according to the sound of the environment to better accommodate the user's remaining hearing. An dedicated adaptation of the sound reproduction to the current sound environment may be advantageous under a lot of circumstances, for example, a different frequency response may be desired when listening to speech in quiet surroundings as compared to listening to speech in noisy surroundings. It would thus be advantageous to make the frequency response dependent on the listening situation, e.g. to provide dedicated responses for situations like a person speaking in quiet surroundings, a person speaking in noisy surroundings, or noisy surroundings without speech. In the following, the term "noise" is used to denote any unwanted signal component with respect to speech intelligibility reproduction.

Various methods for classification of listening situations suitable for use in conjunction with hearing aid systems have been devised for the purpose of identifying the prevailing type of listening situation and adapting the audio reproduction from the hearing aid to the estimated, classified listening situation. These methods may, for instance, exploit analysis of short-term RMS values at different frequencies, the modulation spectrum of the audio signal at different frequencies, or an analysis in the time domain to reveal synchronicity among different frequency bands. All these methods have shortcomings in one way or another, mainly because none of the devised methods utilize more than a mere fraction of the information available.

Another inherent problem is noise picked up from the surroundings by the hearing aid. In a modern society, the origins of the noise may often be mechanical, like transportation means, air blowers, industrial machinery or domestic appliances, or man-made, like radio or television announcements, or background chatter in a restaurant. In order for the hearing aid circuitry to be able to adapt to the noise picked up by the hearing aid, it may be advantageous to subdivide the noise environments into a plurality of different noise environment classes according to the nature and frequency distribution of the particular noise in question.

It is an object of the invention to implement strategies and methods to recognize and categorize acoustic signals from one or more hearing aid microphones and to use such information to adapt sound processing for improved user comfort. Categorization of acoustic signals implies the analysis of the current listening situation to identify which listening situation among a set of stored, specified listening situation templates the current listening situation most closely resembles. The purpose of this categorization is to select a frequency response in a hearing aid capable of producing an optimum result with respect to speech intelligibility and user comfort in the current listening situation.

A further object of the invention is to implement noise environment classification and analysis methods in a hearing aid system, making it possible to adapt sound processing to reduce the amount of noise in the reproduced signal.

SUMMARY OF THE INVENTION

The invention, in a first aspect, provides a hearing aid comprising at least one microphone, a signal processing means and an output transducer, said signal processing means being adapted to receive an audio signal from the microphone, wherein said signal processing means has a table of signal processing parameters mapped to a set of stored noise classes and noise levels, means for classifying a background noise of the audio signal, means for estimating a level of background noise in the audio signal, and means for retrieving, from the table, a set of signal processing parameters according to the classification and the level of background noise and processing the audio signal according to the retrieved set of signal processing parameters to produce a signal to the output transducer.

This makes it possible for the hearing aid to recognize a given, classified noise situation and subsequently take measures to minimize the effects of the noise on the signals reproduced by the hearing aid. Examples of suitable measures comprise adjustment of the gain levels in individual channels in the signal processor, change to another stored programme in the hearing aid more suitable to the current noise situation, or adjustment of compression parameters in the individual channels in the signal processor.

Examination of a wide range of sound environments reveals the fact that the noise floor in a particular sound environment may be estimated by dividing the sound spectrum into a suitable number of frequency bands and estimating the noise level as the energy portion of the signal in each particular frequency band that lies below, say, 10% of the total energy in that band. This method, in the following referred to as the low percentile method, gives good results in practical applications. A noise envelope for the actual sound spectrum in question may be derived by calculating the low percentiles in all the individual frequency bands.

To simplify the calculation, a linear regression scheme may be employed to calculate a best linear fit to the collected low percentiles in the sound spectrum. The slope of the linear fit may then be used in classification of the sound environments. If the frequency spectrum is divided into n bands, the slope of the best linear fit may be determined by the following expression:

$$\alpha = \frac{\sum_{i=1}^{n}((x_i - x_{ave})\cdot(y_i - y_{ave}))}{\sum_{i=1}^{n}(x_i - x_{ave})^2}\ [\text{dB/band}] \quad (1)$$

Where $x_i$ is the i'th band, $x_{ave}$ the average of band 1 to n, $y_i$ is the output from the low percentile in band i, and $y_{ave}$ the average of the low percentiles in all n bands.

This can be simplified even further, since a measure or number expressing the slope of the linear fit is the only information needed:

$$\alpha = \sum_{i=1}^{n}(x_i - x_{ave})\cdot y_i \quad (2)$$

Getting rid of the dimension dB/band thus establishes a comparable figure expressing the slope of the best linear fit through the low percentiles representing the noise frequency distribution in a particular sound environment, as will be shown in the following.

A sound system comprising a microphone and an audio processor is used to pick up and store a sound signal. The frequency spectrum of the recorded sound signal is divided into a suitable number of frequency bands, say, 15 bands, and a low percentile is determined for each band, i.e. the level of the lowest 5% to 15% of the energy of the signal in each band. This yields a set of low percentile data. This data set is then quantified into a classification factor using equation (2). A subset of typical noise types may be arranged into a noise type classification table like the one shown in table 1:

TABLE 1

Noise classification table (from simulations)

| Noise type | Noise classification output range (α) |
|---|---|
| Car noise (four different types) | [−500; −350] |
| Party/Café noise (three types) | [−180; −10] |
| Street noise | [−50; 100] |
| High-frequency sewing machine noise | [200; 650] |

Two things may be learned from this classification table; The noise classification factor range may be either positive or negative, i.e. a positive or negative α, or linear fit slope; noise sources with a dominant low frequency content will tend to have negative slopes, and noise sources with a dominant high frequency slope will tend to have positive slopes. Armed with this knowledge, different noise types may be quantified, and an adaptive reduction of environmental noise in audio processing systems such as hearing aid systems may be achieved.

The spectral distribution of the signal may be analyzed at any instant by splitting up the signal into a number of discrete frequency bands and deriving the instantaneous RMS values from each of these frequency bands. The spectral distribution of the signal in the different frequency bands may be expressed as a vector $\bar{F}(m_1 \ldots m_n, t)$, where m is the frequency band number, and t is the time. The vector $\bar{F}$ represents the spectral distribution of the signal at an arbitrary instant $t_x$.

It is also possible to analyze the temporal variations in the spectral distribution, that is how much the signal level in a particular band varies over time, by splitting up the signal into a number of discrete frequency bands and deriving the instantaneous RMS values from these frequency bands in the same manner as previously described and deriving the range of variations from each of the derived RMS values from each of the frequency bands. The temporal variations in the spectral distribution may also be expressed as a vector, $T(m_1 \ldots m_n, t)$, where m is the frequency band number, and t is the time. The vector T represents the distribution of the spectral variation of the signal at an arbitrary instant $t_x$. In this way, the two vectors F and T, with features characteristic to the signal, may be derived. These vectors may then be used as a basis for categorization of a range of different listening situations.

To be able to put this method of signal analysis to any practical use, it is necessary to obtain a set of reference vectors to be used as a basis for determining the characteristics of the signal. These reference vectors may be obtained by analyzing a number of well-known listening situations and deriving typical reference vectors $F_i$ and $T_i$ for each situation.

Examples of well-known listening situations serving as reference listening situations, i.e. listening situation templates, may comprise, but are not limited to, the following listening situations:

1. speech in quiet surroundings
2. speech in stationary (non-varying) noise
3. speech in impulse-like noise
4. noise without speech
5. music A number of measurements from each of the listening situations are used to obtain the two m-dimensional reference vectors $F_i$ and $T_i$ as typical examples of the vectors F and T. The resulting reference vectors are subsequently stored in the memory of a hearing aid processor where they are used for calculating a real-time estimate of the difference between the actual F and T vectors and the reference vectors $F_i$ and $T_i$.

According to an embodiment of the invention, the hearing aid further comprises a low percentile estimator to analyze the background noise. This is an effective way of analyzing the background noise in an acoustic environment.

Further features of the hearing aid according to the invention appear from the hearing aid subclaims.

The invention, in a second aspect, provides a method of processing signals in a hearing aid, said hearing aid having at least one microphone, a signal processing means and an output transducer, said signal processing means having a table with sets of acoustic processing parameters associated with a set of stored noise classes and noise levels, said method comprising the steps of receiving an audio signal from the microphone, classifying a background noise component in the audio signal, estimating a level of a background noise component in the audio signal, retrieving from the table a set of signal processing parameters according to the classification and the level of background noise, and processing the audio signal according to the retrieved set of signal processing parameters to produce a signal to the output transducer.

This method enables the hearing aid to adapt the signal processing to a plurality of different acoustic environments by continuous analysis of the noise level and noise classification. In a preferred embodiment, the emphasis of this adaptation is to optimize speech intelligibility, but other uses may be derived from alternative embodiments.

Further features of the method according to the invention may be learned from the method subclaims.

BRIEF DESCRIPTION OF THE DRAWINGS

The invention will now be described in more detail using examples illustrated in the drawings, where.

DETAILED DESCRIPTION OF THE INVENTION

Figure 1:
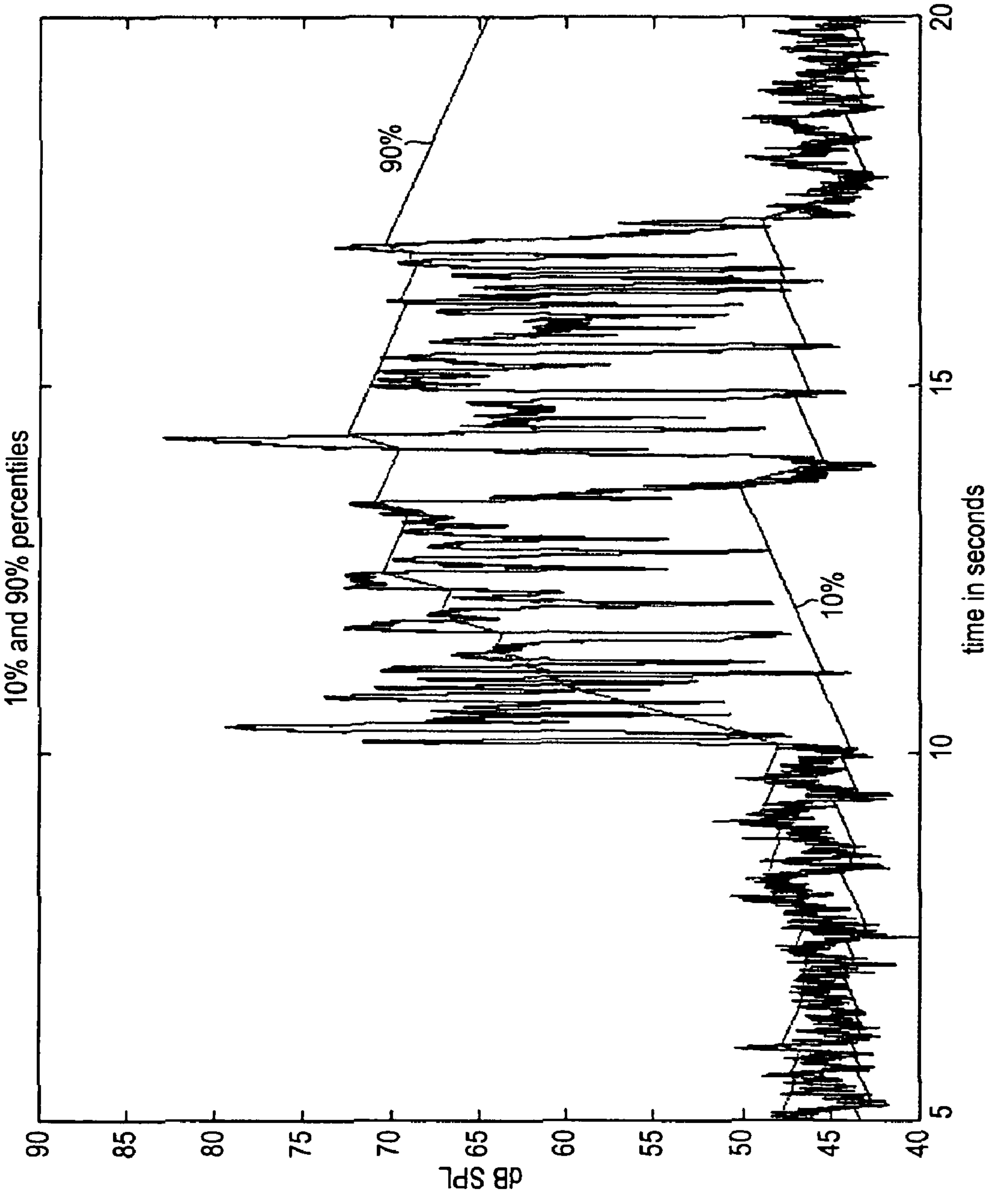
FIG. 1 is a graph showing the low and high percentiles in a speech signal.

In FIG. 1, a digitized sound signal fragment with a duration of 20 seconds is shown, enveloped by two curves representing the low percentile and the high percentile, respectively. The first 10 seconds of the sound signal consist mainly of noise with a level between approximately 40 and 50 dB SPL. The next 7-8 seconds is a speech signal superimposed with noise, the resulting signal having a level of approximately 45 to 75 dB SPL. The last 2-3 seconds of the signal in FIG. 1 are noise.

The low percentile is derived from the signal in the following way: The signal is divided into "frames" of equal duration, say, 125 ms, and the average level of each frame is compared to the average level of the preceding frame. The frames may be realized as buffers in the signal processor memory each holding a number of samples of the input signal. If the level of the current frame is higher than the level of the preceding frame, the low percentile level is incremented by the difference between the current level and the level of the preceding frame, i.e. a relatively slow increment. The low percentile may be a percentage of the signal from 5% to 15%, preferably 10%. If, however, the level of the current frame is lower than the level of the preceding frame, the low percentile level is decremented by a constant factor, say, nine to ten times the difference between the current level and the level of the preceding frame, i.e. a relatively fast decrement. This way of processing frame by frame renders a curve following the low energy distribution of the signal depending on the chosen percentage.

Similarly, the high percentile is derived from the signal by comparing the average level of the current frame to the average level of the preceding frame. If the level of the current frame is lower than the level of the preceding frame, the high percentile level is decremented by the difference between the current level and the level of the preceding frame, i.e. a relatively slow decrement. If, however, the level of the current frame is higher than the level of the preceding frame, the high percentile level is incremented by a constant factor, say, nine to ten times the difference between the current level and the level of the preceding frame, i.e. a relatively fast increment. The high percentile may be a percentage of the signal from 85% to 95%, preferably 90%. This type of processing renders a curve approximating the high energy distribution of the signal depending on the chosen percentage.

As shown in FIG. 1, the two curves making up the low percentile and the high percentile form an envelope around the signal. The information derived from the two percentile curves may be utilized in several different ways. The low percentile may, for instance, be used for determining the noise floor in the signal, and the high percentile may be used for controlling a limiter algorithm, or the like, applied to prevent the signal from overloading subsequent processing stages.

Figure 2:
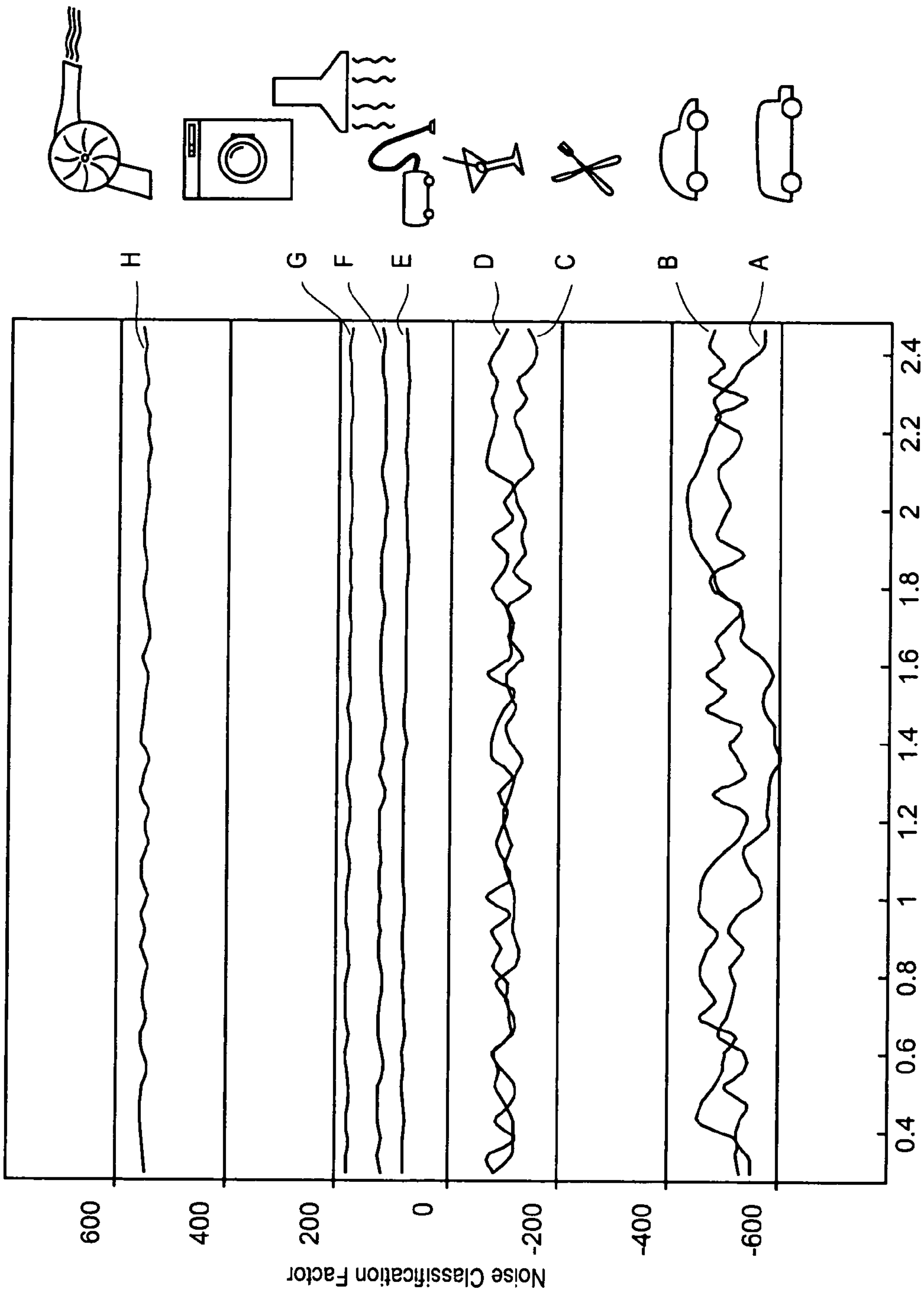
FIG. 2 is a graph illustrating the classification of noise by comparing different noise samples taken over a period of time.

An exemplified noise classification is shown in FIG. 2, where several different noise sources have been classified using the classification algorithm described earlier. For reference, the eight noise source examples are denoted A to H. Each noise type has been recorded over a period of time, and the resulting noise classification index expressed as a graph. Generally, there is a direct relationship between the high frequency content of the noise source and the noise classification index, although the two different terms by no means can be considered equal.

Noise source example A is the engine noise from a bus. It is relatively low in frequency and constant in nature, and has thus been assigned a noise classification index of around −500 to −550. Noise source example B is the engine noise from a car, being similar in nature to noise source example A and having been assigned a noise classification index of −450 to −550. Noise source example C is restaurant noise, i.e. people talking and cutlery rattling. This has been assigned a noise classification index of −100 to −150. Noise source example D is party noise and very similar to noise source example C, and has been assigned a noise classification index of between −50 and −100.

Noise source example E is a vacuum cleaner and has been assigned a noise classification index of about 50. Noise source example F is the noise of a cooking canopy or ventilator having characteristics similar to noise source example E, and it has been assigned a noise classification index of 100 to 150. The noise source example G in FIG. 2 is a laundering machine, and it has been assigned a noise classification index of about 200, and the last noise source example, H, is a hair dryer, which has been assigned a noise classification index of 500 to 550 due to the more dominant high frequency content when compared with the other noise classification indices in FIG. 2. These noise classes are incorporated as examples only, and are not in any way limiting to the scope of the invention.

Figure 3:
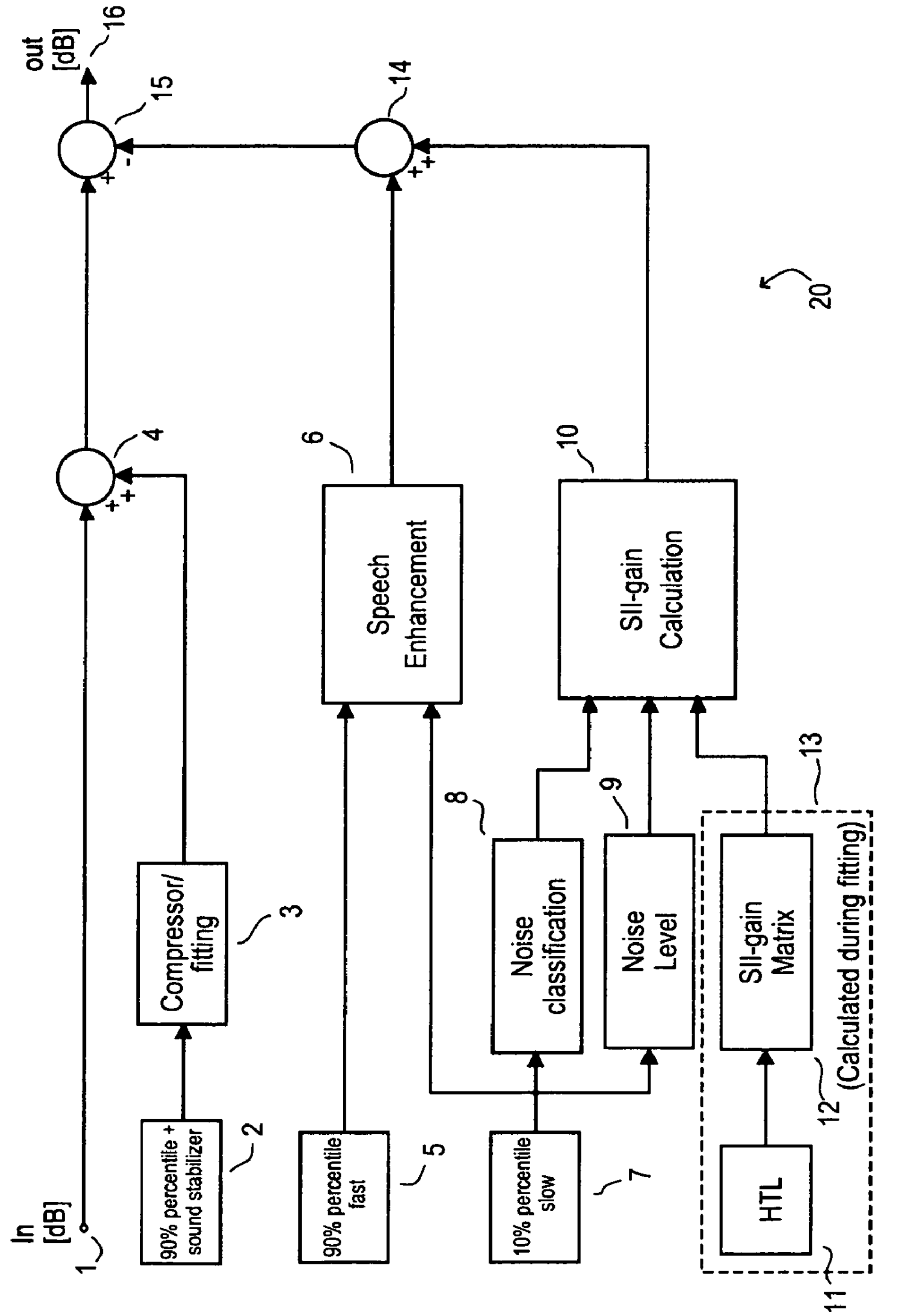
FIG. 3 is a schematic block diagram showing a signal processing block in a hearing aid with noise classification means according to the invention.

In FIG. 3 is shown an embodiment of the invention comprising a signal processing block 20 with two main stages. For clarity, the signal processing block 20 is subdivided into more stages in the following. The first stage of the signal processing block 20 comprises a high percentile and sound stabilizer block 2 and a compressor/fitting block 3. The output from compressor/fitting block 3 and from the input terminal 1 are summed in summation block 4.

The second stage of the signal processing block 20, being a bit more complex, comprises a fast reacting high percentile block 5 connected to a speech enhancement block 6, a slow reacting low percentile block 7 connected to a noise classification block 8, and a noise level evaluation block 9 connected to a speech intelligibility index gain calculation block 10. The second stage further comprises a gain weighing block 13, which includes a hearing threshold level block 11 connected to a speech intelligibility index gain matrix block 12, and which is connected to the speech intelligibility index gain calculation block 10. The latter is used during the fitting procedure only, and will not be described in further detail here.

The speech intelligibility index gain calculation block 10 and the speech enhancement block 6 are both connected to a summation block 14, and the output from the summation block 14 is connected to the negative input of a subtraction block 15. The output of the subtraction block 15 is available at an output terminal 16, comprising the output of the signal processing block 20.

The signal from the high percentile and sound stabilizer block 2 of the signal processing block 20 is fed to the compressor/fitting block 3, where compression ratios for individual frequency bands are calculated. An input signal is fed to the input terminal 1 and is added to the signal from the compressor/fitting block 3 in the summation block 4. The output signal from the summation block 4 is connected to the positive input of the subtraction block 15.

The signal from the high percentile fast block 5 is fed to a first input of the speech enhancement block 6. The signal from the low percentile slow block 7 is fed to a second input of the speech enhancement block 6. These percentile signals are envelope representations of the high percentile and the low percentile, respectively, as derived from the input signal. The signal from the low percentile slow block 7 is also fed to the inputs of the noise classification block 8 and of the noise level block 9, respectively. The noise classification block 8 classifies the noise according to equation (1), and the resulting signal is used as the first of three sets of parameters for the SII-gain-calculation block 10. The noise level block 9 determines the noise level of the signal as derived from the low percentile slow block 7, and the resulting signal is used for the second of three sets of parameters for the SII-gain-calculation block 10.

The gain weighing block 13, comprising the hearing threshold level block 11 and the SII-gain matrix block 12, provides the third of three sets of parameters for the SII-gain-calculation block 10. This parameter set is calculated by the fitting software during fitting of the hearing aid, and the resulting set of parameters are a set of constants determined by the hearing threshold level and the user's hearing loss. The three sets of parameters in the SII-gain-calculation block 10 are used as input variables to calculate gain settings in the individual frequency bands that optimize the speech intelligibility index.

The output signal from the SII-gain calculation block 10 is added to the output from the speech enhancement block 6 in the summation block 14, and the resulting signal is fed to the summation block 15, where the signal from the summation block 14 is subtracted from the signal from the summation block 4. The output signal presented on the output terminal 16 of the signal processing block 20 may thus be considered as the compressed and fitting-compensated input signal minus an estimated error- or noise signal. The closer the estimated error signal is to the actual error signal, the more noise the signal processing block will be able to remove from the signal without leaving audible artifacts.

A preferred embodiment of the noise classification system has response times that equal the time constants of the low percentile. These times are approximately between 1.5 and 2 dB/sec when levels are rising and approximately 15 to 20 dB/sec when levels are falling. As a consequence, the noise classification system is able to classify the noise adequately in a situation where the environmental noise level changes from relatively quiet, say, 45 dB SPL, to relatively noisy, say, 80 dB SPL, within about 20 seconds. On the other hand, if the noise level changes from relatively noisy to relatively quiet, the noise classification system is able to adapt within about 2 seconds.

This enables the noise classification system to adapt the signal processing in a hearing aid relatively fast as a user of the hearing aid moves between different noise environments. The results from the noise classification system may then be used by the hearing aid processor to adapt the frequency response and other parameters in the hearing aid to optimize the signal reproduction to enhance speech in a variety of different noisy environments.

Figure 4:
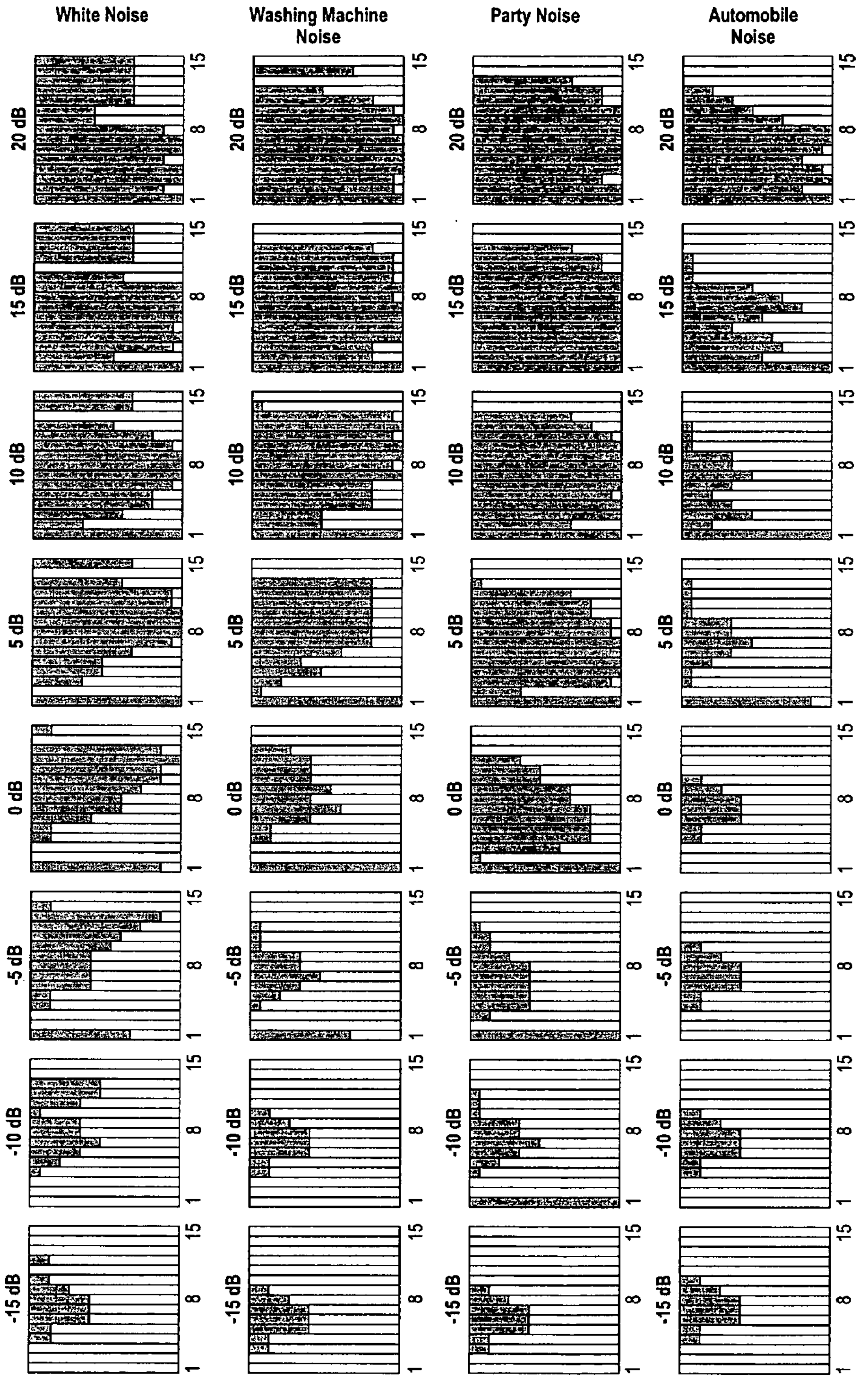
FIG. 4 is an illustration of a set of predetermined gain vectors derived from different noise classifications at different levels for a flat, 30 dB hearing loss.

FIG. 4 is a schematic representation of estimated gain matrix compensation vectors for a flat 30 dB hearing loss derived from four of the noise class examples in FIG. 2 at eight different noise levels. Each of the 32 separate diagrams shows the 15 frequency bands in which audio processing takes place with the relative compensation values (negative) shown in gray. The upper row of diagrams represents the estimated gain matrix compensation vectors for the class of white noise, indicated in gray, at the noise levels −15 dB, −10 dB, −5 dB, 0 dB, 5 dB, 10 dB, 15 dB, and 20 dB, respectively. All noise levels correspond to a sound pressure level of 70 dB SPL, relatively. Similarly, the second, third, and fourth row from the top represent the estimated gain matrix compensation vectors at respective levels for classes of washing machine noise, party noise, and automobile noise, respectively. The estimated gain matrix compensation vectors have been found by applying equation (2) to a speech intelligibility index function and the noise profile in question and interpolating the result to the current noise level and noise type.

As can be seen in FIG. 4, the vector diagrams representing different noise classes with a level below 0 dB has a relatively modest gray area, indicating that only a small amount of compensation is needed to reduce noise at low levels. The diagrams representing different noise classes with a level of 0 dB and above has a more significant gray area, indicating that a larger amount of compensation is needed to reduce noise at higher levels.

In a preferred embodiment, sets of gain matrix compensation vector values are stored as a lookup table in a dedicated memory of the hearing aid, and an algorithm may then use the estimated gain matrix compensation values to determine the compensation needed in a particular situation by selecting a noise class and estimating the noise level and looking up the appropriate gain matrix compensation vector in the lookup table. If the estimated noise classification index has a value close to the borderline of the selected noise class, say, party noise or washing machine noise, the algorithm may interpolate to define a gain matrix compensation vector by a set of values representing the mean values between two adjacent gain matrix rows in the lookup table. If the estimated noise level has a value close to the range of the adjacent noise level, say, 7 dB, the algorithm may interpolate to define a gain matrix compensation vector by a value representing the mean between two adjacent gain matrix columns in the lookup table.

Figure 5:
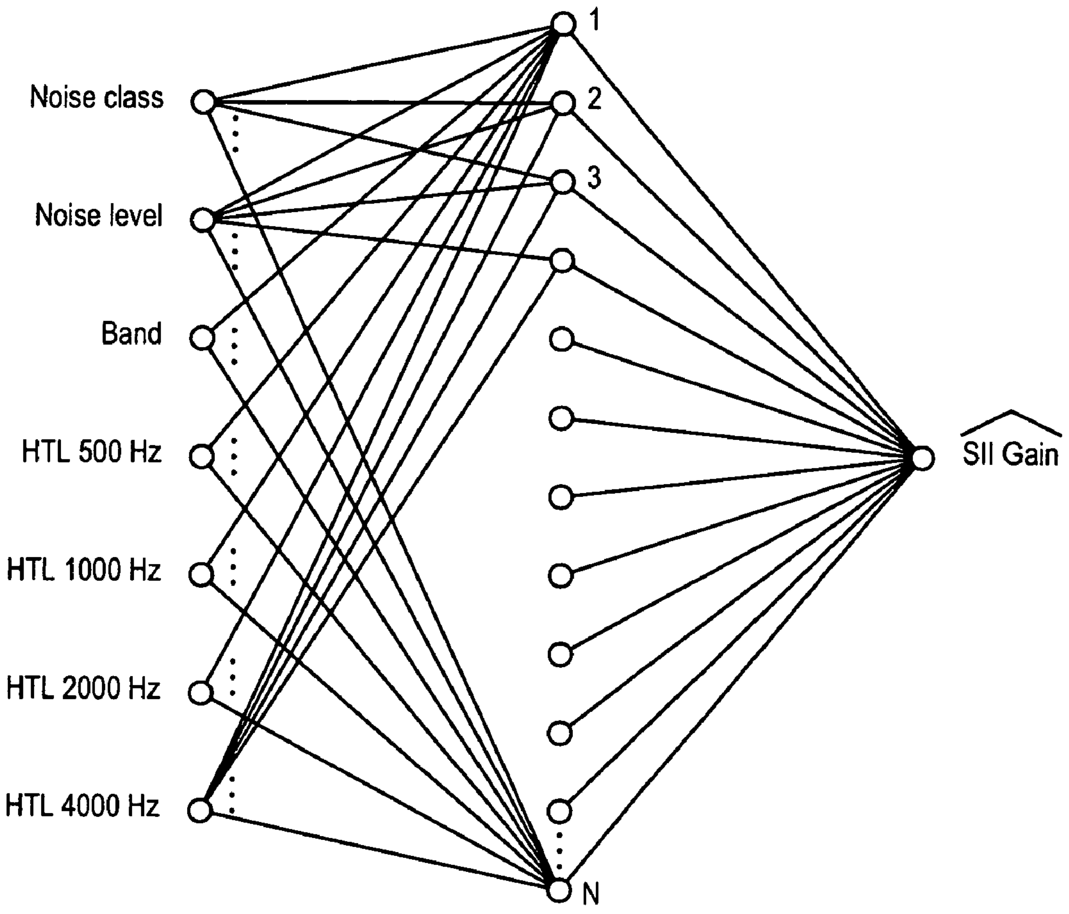
FIG. 5 shows a neural network for determining the speech intelligibility index SII gain for individual frequency bands in a hearing aid.

An embodiment of the SII gain calculation block 10 in FIG. 3 is shown in FIG. 5 as a fully connected neural network architecture with seven input units, N hidden hyperbolic tangent units, and one output unit, arranged to produce an SII gain value from a set of recognized parameter variables. The SII gain value is a function of noise class, noise level, frequency band number, and four predetermined hearing threshold level values at 500 Hz, 1 kHz, 2 kHz, and 4 kHz.

The neural net in FIG. 5 may preferably be trained using the Levenberg-Marquardt training method. This training method was implemented in a simulation with a training set of 100 randomly generated, different hearing losses and corresponding SII gain values.

The concept of speech intelligibility index (SII) is discussed in greater detail in the ANSI S3.5-1969 standard (revised 1997), which standard provides methods for the calculation of the speech intelligibility index, SII. The SII makes it possible to predict the intelligible amount of the transmitted speech information, and thus, the speech intelligibility in a linear transmission system. A more comprehensive description of neural nets and training methods in general may be found in Haykin, "Neural Networks: A Comprehensive Foundation", 2. ed., 1998.

The hearing losses could be taken from real, clinical data, or they may be generated randomly using statistical methods as is the case with the example described here. During training, the neural net is preferably embodied as a piece of software in a common computer. After training of the neural net, the training was verified using another 100 randomly generated, different hearing losses as examples on which to estimate the parameter sets. This verification procedure was carried out to ensure that the neural net will be able to estimate the SII gain value for a given, future hearing loss with sufficient accuracy.

After verification of the training of the neural net, the training parameters in the neural net are locked, and the parameter values, represented by the N hidden units or nodes in FIG. 5, may be transferred to an identical neural net in a hearing aid, embodied as an integral part of the SII gain calculation unit 10 in FIG. 3. This gives the SII gain calculation unit a capability to estimate the SII gain value for a given hearing loss when fed a noise class, a noise level, and a set of individual gain compensation matrix values for the 15 different frequency bands in the hearing aid.

The neural net delivers a qualified estimate of the SII gain value at a given instant. The noise level and the noise class change over time with the variations in the signal picked up by the microphone.

Figure 6:
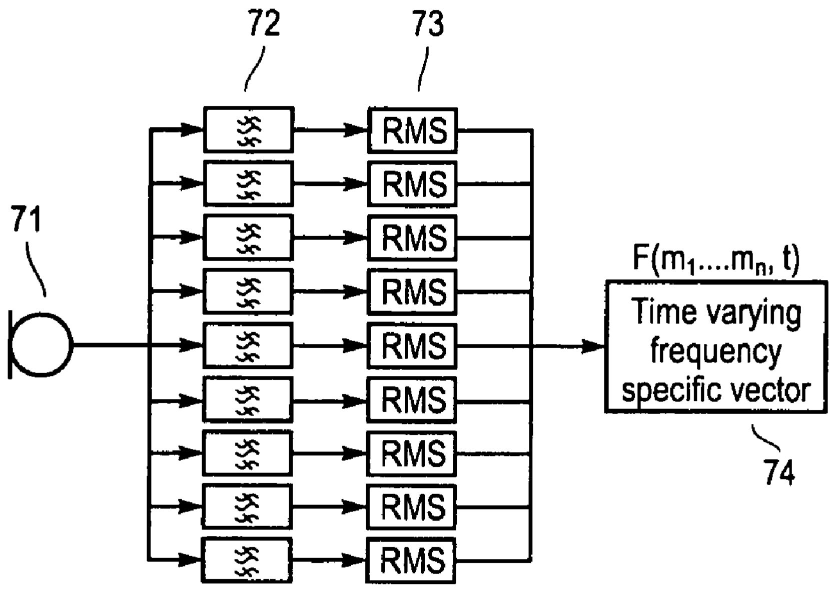
FIG. 6 shows a simplified system for analyzing the spectral distribution of a signal.

The system in FIG. 6 is an embodiment of a system for analyzing the spectral distribution of a signal in a hearing aid. The signal from the sound source 71 is split into a number of frequency bands using a set of band pass filters 72, and the output signals from the set of band pass filters 72 are fed to a number of RMS detectors 73, each one outputting the RMS value of the signal level in that particular frequency band. The signals from the RMS detectors 73 are summed, and a resulting spectral distribution vector $\bar{F}$ is calculated in the block 74, denoted the time varying frequency specific vector. The spectral distribution vector $\bar{F}$ represents the spectral distribution of the signal at a given instant, and may be used for characterizing the signal.

Figure 7:
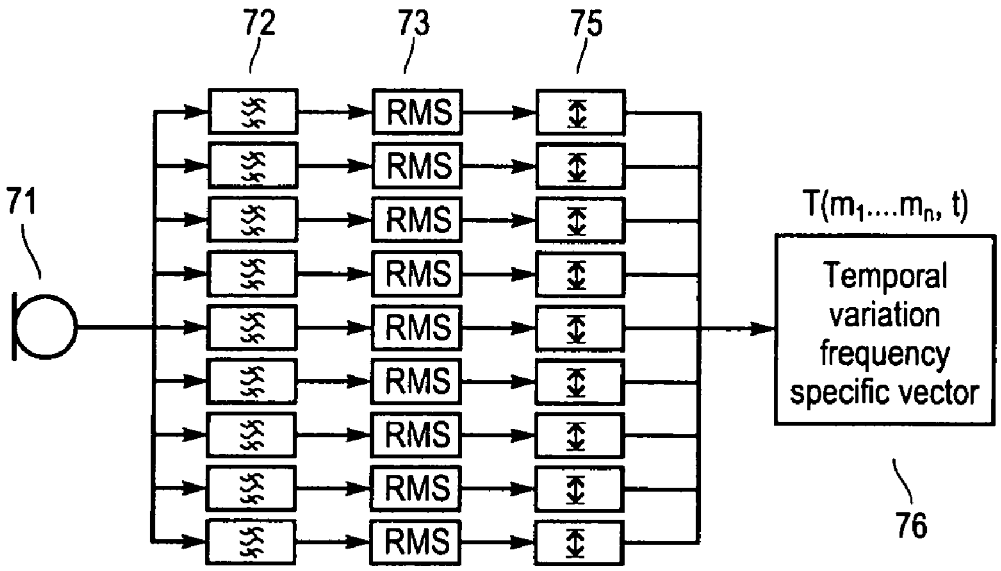
FIG. 7 shows a simplified system for analyzing the spectral variation of a signal.

The system in FIG. 7 is a simplified system for analyzing the spectral variation of a signal in a hearing aid. In a manner similar to that described with reference to FIG. 6, the spectral distribution is derived from the signal source 71 by using a number of band pass filters 72 and a number of RMS detectors 73. In the system in FIG. 7, the signals from the RMS detectors 73 are fed to a number of range detectors 75. The purpose of the range detectors 75 is to determine the variations in level over time in the individual frequency bands derived from the band pass filters 72 and the RMS detectors 73. The signals from the range detectors 75 are summed, and a resulting spectral variation vector $\bar{T}$ is calculated in the block 76, denoted the temporal variation frequency specific vector. The spectral variation vector $\bar{T}$ represents the spectral variation of the signal at a given instant, and may also be used for characterizing the signal.

A more thorough characterization of the signal is obtained by combining the values from the spectral distribution vector $\vec{F}$ and the spectral variation vector $\vec{T}$. This accounts for both the spectral distribution in the signal and the variations in that distribution over time.

Figure 8:
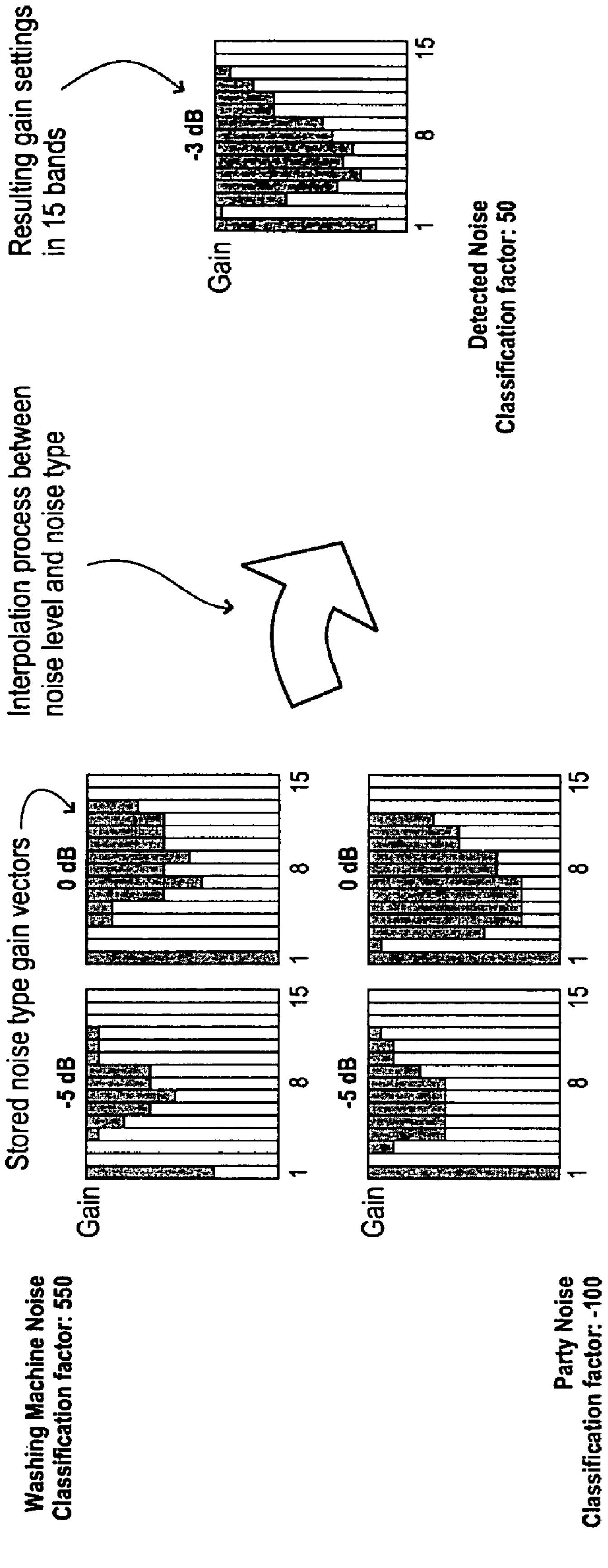
FIG. 8 shows how the system according to the invention may interpolate between the different, predetermined gain vectors in FIG. 4.

FIG. 8 illustrates how the hearing aid according to the invention interpolates an optimized gain setting using the set of predetermined gain vectors shown in FIG. 4, an exemplified noise level of −3 dB, and a detected noise classification factor of 50, e.g. originating from a nearby electrical motor of some sort, say, an electrical kitchen appliance. Using the set of predetermined gain vectors as a lookup table, the hearing aid processor uses the detected noise classification factor to determine the closest matching noise type, and uses the detected noise level to determine the closest matching noise level in the lookup table. Using the calculated gain value matrix described previously, the hearing aid processor then interpolates the gain values from the entries in the table lying above and below the detected noise level and the entries in the table lying above and below the detected noise classification factor. The interpolated gain values are then used to adjust the actual gain values in the individual frequency bands in the hearing aid processor to the optimized values that reduce the particular noise.

Figure 9:
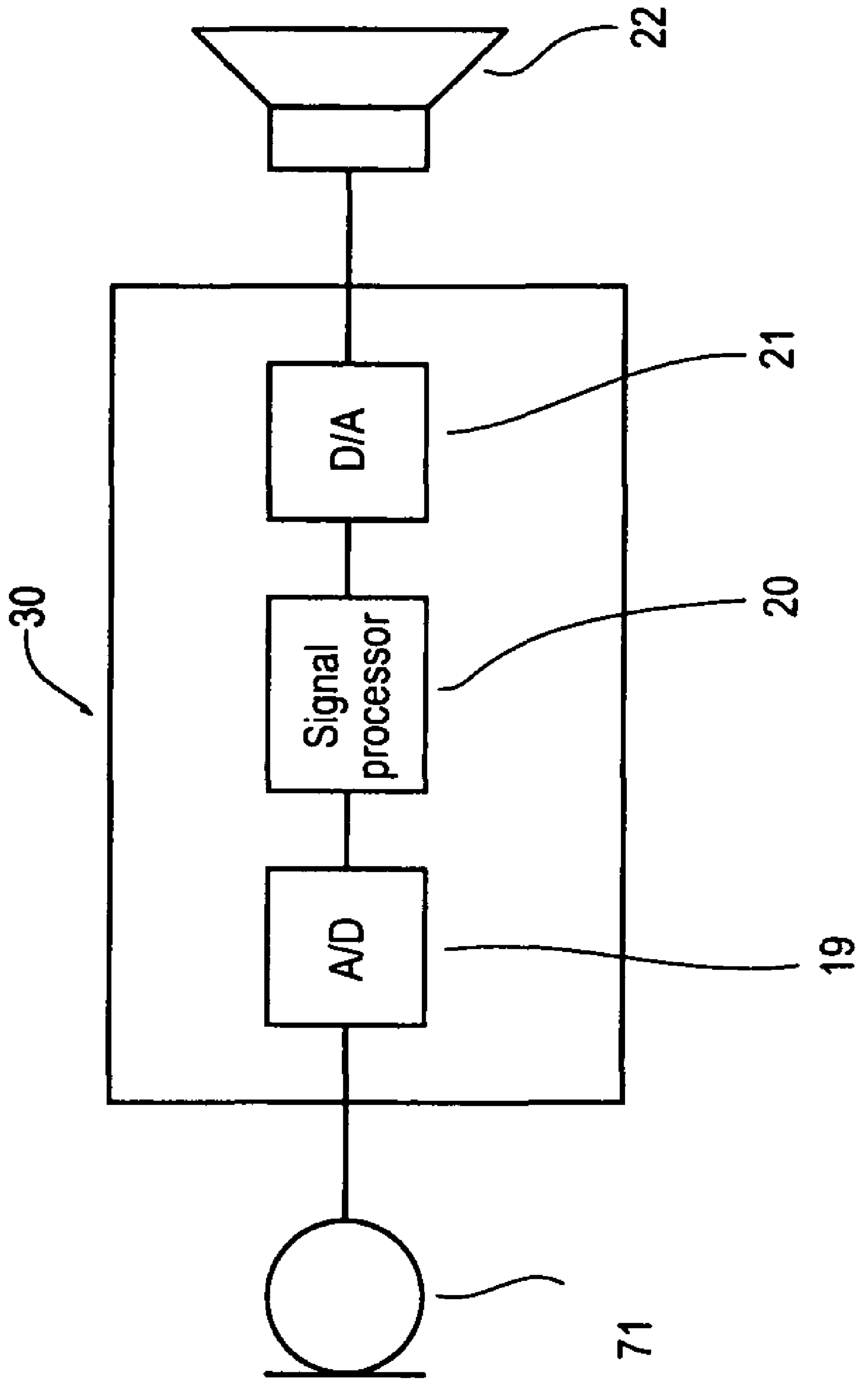
FIG. 9 shows a hearing aid according to the invention.

FIG. 9 is a block schematic showing a hearing aid 30 comprising a microphone 71 connected to the input of an analog/digital converter 19. The output of the analog/digital converter 19 is connected to a signal processor 20, similar to the one shown in FIG. 3, comprising additional signal processing means (not shown) for filtering, compressing and amplifying the input signal. The output of the signal processor 20 is connected to the input of a digital/analog converter 21, and the output of the digital/analog converter 21 is connected to an acoustic output transducer 22.

Audio signals entering the microphone 71 of the hearing aid 30 are converted into analog, electrical signals by the microphone 71. The analog, electrical signal is converted into a digital signal by the analog/digital converter 19 and fed to the signal processor 20 as a discrete data stream. The data stream representing the input signal from the microphone 71 is analyzed, conditioned and amplified by the signal processor 20 in accordance with the functional block diagram in FIG. 3, and the conditioned, amplified digital signal is then converted by the digital/analog converter 21 into an analog, electrical signal sufficiently powerful to drive the output transducer 22. Depending on the configuration of the signal processor 20, it may, in an alternative embodiment, be adapted to drive the output transducer 22 directly without the need for a digital/analog converter.

The hearing aid according to the invention is thus able to adapt its signal processing to variations in the environmental noise level and characteristics at an adaptation speed comparable to the changing speed of the low percentile. A preferred embodiment has a set of rules relating to speech intelligibility implemented in the hearing aid processor in order to optimize the signal processing—and the noise reduction based on the analysis—to an improvement in signal reproduction to benefit intelligibility of speech in the reproduced audio signal. These rules are preferably based on the theory of the speech intelligibility index, but may be adapted to other beneficial parameters relating to audio reproduction in alternative embodiments.

In an alternative embodiment, other parameters than the individual frequency band gain values may be incorporated as output control parameters from the neural net. These values may, for example, be attack or release times for gain adjustments, compression ratio, noise reduction parameters, microphone directivity, listening programme, frequency shaping, and other parameters. Alternative embodiments that incorporate several of these parameters may easily be implemented, and the selection of which parameters will be affected by the analysis may be applied by the hearing aid dispenser at the time of fitting the hearing aid to the individual user.

In another alternative embodiment, a neural net may be set up to adjust the plurality of gain values based on a training set of a superset of exemplified noise classification values, noise levels, and hearing losses, instead of using a matrix of precalculated gain values.

We claim:

1. A hearing aid comprising at least one microphone, a signal processing means and an output transducer, said signal processing means being adapted to receive an audio signal from the microphone, wherein said signal processing means has a table of signal processing parameters mapped to a set of stored noise classes and noise levels, means for classifying a background noise of the audio signal, means for estimating a level of background noise in the audio signal, and means for retrieving, from the table, a set of signal processing parameters according to the classification and the level of background noise and processing the audio signal according to the retrieved set of signal processing parameters to produce a signal to the output transducer;

wherein said signal processing means comprises means for calculating a speech intelligibility index gain.

2. The hearing aid according to claim 1, wherein said means for classifying a background noise comprises a low percentile estimator.

3. The hearing aid according to claim 1, wherein said signal processing means is adapted to select a set of acoustic processing parameters based on an interpolation between a plurality of stored sets of acoustic processing parameters.

4. The hearing aid according to claim 1, wherein said means for calculating speech intelligibility index gain comprises a trained, neural net adapted to calculate the speech intelligibility index gain as a function of a plurality of input parameters.

5. The hearing aid according to claim 1, wherein the means for calculating speech intelligibility index gain comprises a speech intelligibility index gain matrix calculated during the fitting stage as a function of the hearing threshold level.

6. The hearing aid according to claim 1, wherein said means for calculating speech intelligibility index gain comprises a vector processor adapted to calculate the speech intelligibility index gain as a function of a plurality of input parameters.

7. The hearing aid according to claim 1, wherein said means for calculating the speech intelligibility index gain incorporates as input parameters a set of hearing threshold levels, the estimated level of background noise, and the classification of background noise.

8. A method of processing signals in a hearing aid, said hearing aid having at least one microphone, a signal processing means and an output transducer, said signal processing means having a table with sets of acoustic processing parameters associated with a set of stored noise classes and noise levels, said method comprising the steps of receiving an audio signal from the microphone, classifying a background noise component in the audio signal, estimating a level of a background noise component in the audio signal, retrieving from the table a set of signal processing parameters according to the classification and the level of background noise, a speech intelligibility index gain calculation, taking as inputs a set of hearing threshold levels, an estimated noise level, and a noise classification, and processing the audio signal according to the retrieved set of signal processing parameters to produce a signal to the output transducer.

9. The method according to claim 8, comprising a step of modifying the signal processing parameters in order to optimize the speech intelligibility index.

10. The method according to claim 8, wherein the step of estimating a level of background noise, in a situation where the environmental noise is increasing over time, has an adaptation speed of at least 2 dB/second.

11. The method according to claim 8, wherein the step of estimating a level of background noise, in a situation where the environmental noise is decreasing over time, has an adaptation speed of at least 15 dB/second.

* * * * *